United States Patent [19]

Houlton et al.

[11] 3,985,685
[45] Oct. 12, 1976

[54] PYROELECTRIC MATERIALS AND DEVICES

[75] Inventors: Michael Richard Houlton; Gordon Robert Jones; Norman Shaw, all of Malvern, England

[73] Assignee: The Secretary of State for Defence in Her Britannic Majesty's Government of the United Kingdom of Great Britain and Northern Ireland, London, England

[22] Filed: Oct. 22, 1975

[21] Appl. No.: 624,692

[30] Foreign Application Priority Data

Oct. 26, 1974 United Kingdom............... 46400/74

[52] U.S. Cl............................. 252/521; 252/518; 250/338; 250/370; 313/14
[51] Int. Cl.².............................................. H01B 1/06
[58] Field of Search ............ 252/521, 518; 423/619, 423/593; 250/338; 313/14

[56] References Cited
UNITED STATES PATENTS 3,831,029   8/1975   Jones et al. ......................... 250/338
3,930,157   12/1975  Watton ........................... 250/338 X

*Primary Examiner*—Benjamin R. Padgett
*Assistant Examiner*—E. Suzanne Parr
*Attorney, Agent, or Firm*—Pollock, VandeSande & Priddy

[57] ABSTRACT

A novel pyroelectric material is provided by doping lead germanate with barium to provide the composition $Pb_{5-x}Ba_xGe_3O_{11}$ $0<x \leq 0.5$. The material has a pyroelectric coefficient comparable to that of triglycine sulphate (TGS).

5 Claims, 4 Drawing Figures

PYROELECTRIC MATERIALS AND DEVICES

The present invention relates to pyroelectric materials and devices made from them.

There are several known pyroelectric devices which can be used to convert an infra-red image into a visual one. The essential part of each device is the pyroelectric material from which the device is made. This material undergoes a change in electric polarisation which produces a change in surface electric charge when the material is exposed to infra-red radiation. The surface charge can thus be read out to provide a measure of the infra-red radiation.

For a number of years the material triglycine (TGS) sulphate and its derivatives were regarded as the best available family of pyroelectric materials. However these materials were known to be far from ideal for the following reasons. They are hygroscopic and hence physically unstable over a period of time when used in a device. The results obtained with them are not satisfactorily reproducible from device-to-device. They have a high electrical resistivity and are consequently unsuitable for the simple 'conduction pedestal' mode of pyroelectric camera tube operation described in German Offenlegungsschrift No. 2435400.

A recent prior art approach alternative to using the TGS family is described in USA Pat. specification No. 3,831,029. The use of lead germanate $Pb_5 Ge_3 O_{11}$ as a pyroelectric material is described therein. This material has the advantages over TGS of a greater stability, more reproducible results and a much lower electrical resistivity allowing 'conduction pedestal' camera tube operation. Although lead germanate shows these advantages over TGS its pyroelectric coefficient (typically less than $1 \times 10^{-8}$ Coulomb cm$^{-2}$ °K$^{-1}$) is unfortunately less than that of TGS (typically $3.5 \times 10^{-8}$ Coulomb cm$^{-2}$ °K$^{-1}$) and TGS is consequently able to give better resolution when detecting an image by the pyroelectric effect.

According to the present invention a pyroelectric material has the compositional formula $Pb_{5-x} Ba_x Ge_3 O_{11}$ where $x$ is in the range $0 < x \leq 0.5$. This material will hereinafter be referred to as 'substituted lead germanate.'

By doping lead germanate with barium to produce substituted lead germanate the pyroelectric coefficient of the lead germanate may be significantly increased to values comparable to those for TGS (typically $3.5 \times 10^{-8}$ Coulomb cm$^{-2}$ °K$^{-1}$) without significantly affecting any of the other advantages lead germanate has compared with TGS.

The invention will now be described by way of examples in the following description partly with reference to the accompanying drawings, in which.

Figure 1:
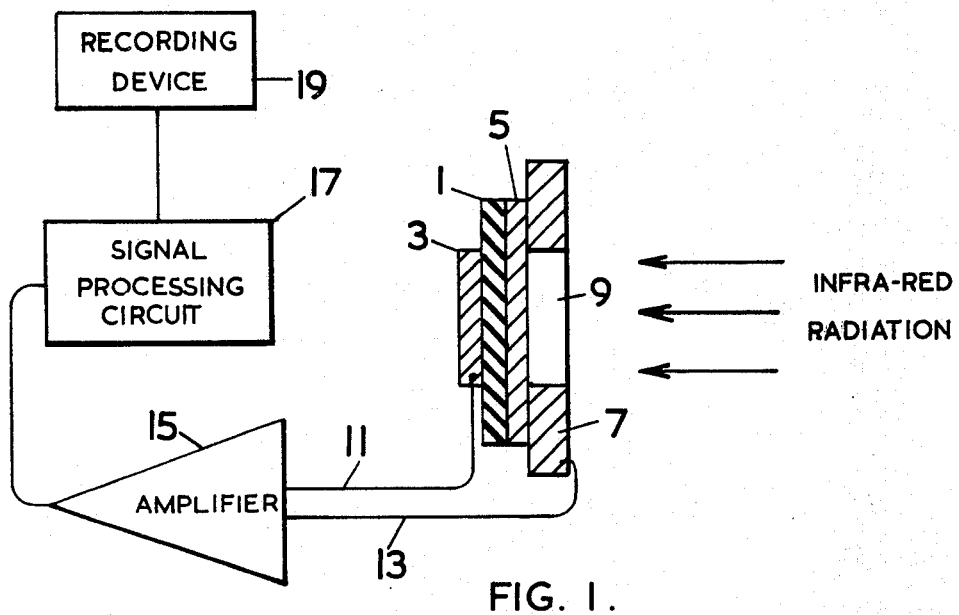
FIG. 1 is a diagram partly in cross-section and partly in schematic circuit form of a single element pyroelectric infra-red radiation detector embodying the present invention.

Substituted lead germanate may be made either in single crystal form or in polycrystalline ceramic form for use in pyroelectric devices.

Single crystal specimens of the material may be made by any of the conventional growth from the melt techniques. For example for Czochralski technique may be used. Stoichiometric amounts of the appropriate elements are first melted together at about 750° C to yield on cooling polycrystalline mass of the substituted lead germanate which can subsequently be used to form the Czochralski melt. The elements Pb, Ba, Ge and O may be in elemental form or any other suitable form as starting materials. For example the oxides PbO, BaO and $GeO_2$ may be used in the correct proportions to give the reaction:

Alternatively the carbonate, $BaCO_3$ together with the oxides PbO and $GeO_2$ may be used. The carbonate decomposes on heating to yield the oxide as above:

For the Czhochralski growth the polycrystalline substituted lead germanate is preferably contained in a platinum or gold crucible. If the crucible is made of gold the growth may be carried out in an atmosphere of air, oxygen or an inert gas. If the crucible is made of platinum oxygen must be excluded, otherwise inclusions may occur in the growing crystal. A growth (pulling) rate of about 1 mm per hour and a liquid/solid interface temperature gradient of the order of 20° C/mm have been found to be suitable.

Ceramic polycrystalline specimens of substituted lead germanate may be prepared either by hot or cold pressing. The starting materials are as for the Czochralski technique above; they are again in stoichiometric proportions.

For example cold pressing may be carried out at a pressure of about 10 tons per square inch on a mixture of PbO, BaO and $GeO_2$. Substituted lead germanate is obtained from the resultant grains be sintering at about 700° C. The reaction between the oxides takes place in the solid state.

For a single crystal of barium doped lead germanate having the formula $Pb_{4.8} Ba_{0.2} Ge_3 O_{11}$ the following properties relevant to pyroelectric device performance have been measured:

Pyroelectric coefficient = $2.5 \times 10^{-8}$ Coulomb cm$^{-2}$ °K$^{-1}$

Dielectric constant in the range 0 to $10^5$Hz = 57
Dielectric loss tangent, tan $\delta$, at 90Hz = 0.003
Electrical resistivity at 90Hz = $1 \times 10^{11}$ ohm cm
For a single crystal having the formula $Pb_{4.7} Ba_{0.3} Ge_3 O_{11}$ the following properties have been measured:
Pyroelectric coefficient = $5 \times 10^{-8}$ Coulomb cm$^{-2}$ °K$^{-1}$ Dielectric constant in the range 0 to $10^5$Hz = 160
Dielectric loss tangent at 90Hz = 0.008
Electrical resistivity at 90Hz = $1.4 \times 10^{10}$ ohm cm These results indicate that barium doped lead germanate in either single crystal or ceramic form is an attractive pyroelectric material.

When the material is newly prepared it contains ferroelectric domains which are randomly orientated and which provide only a small net electric polarisation.

In common with some pyroelectric materials substituted lead germanate must be "poled" before it can be used in a device. Poling involves applying a high (between about 10 and about 30 kV per cm) steady electric field across the material so that the domains may be aligned to provide a relatively large electric polarisation.

Examples of pyroelectric devices in which substituted lead germanate is used will now be described.

FIG. 1 is a diagram partly in cross-section and partly in schematic circuit form of a single element pyroelectric infrared radiation detector embodying the present invention. The detector includes a slice 1, of either single crystal or ceramic substituted lead germanate having a thickness less than 100 μm. If the slice 1 is single crystal it is cut so that its plane is perpendicular to the trigonal C axis or axis of polarisation of the material. The slice 1 is sandwiched between an opaque electrode 3 smaller in area than the slice 1 and an electrode 5 transparent to infrared radiation. The electrode 5 is deposited on a conducting mount 7 having a hollow portion 9 concentric with the electrode 3. The electrode 5 and the electrode 3 may for example be made of nickel-chromium alloy (which is semi-transparent) and gold respectively, evaporated on the respective surfaces of the slice 1. A signal lead 11 is attached to the electrode 3 and a signal lead 13 is attached to the electrode 5.

When infrared radiation is incident via the electrode 5 on the slice 1 a change in the surface charge on the slice 1 occurs by virtue of the pyroelectric effect. The charge is detected by means of the leads 11 and 13 as a voltage or a current in an amplifier 15. The output of the amplifier is processed by a conventional signal processing circuit 17 which is used to extract the signal from noise. The output of the circuit 17 is recorded by a conventional recording device 19.

The amplifier 15 has for the purpose of increased detectivity, a junction field effect transistor (JFET) as its first stage. For example a Texas Instruments BS 800 JFET which is specially designed for the purpose of pyroelectric detection has been found very useful in this connection. The electrical signal recorded by the recording device may be used to provide a measure of the intensity or the modulation frequency of the detected radiation. Alternatively it may be converted into an optical signal in the visible range by means of a suitable electroluminescent medium for visual display.

Pyroelectric devices can be used in various ways to provide thermal imaging systems. For example a single detector can be used, and the picture can be built up by scanning the image across it using a two dimensional mechanical scanning system. In this type of arrangement the detector should have a high detectivity and a wide frequency bandwidth if a reasonably fast frame rate is required. Another example of a thermal imaging system uses a row of detectors constituting a one-dimensional television line. The picture is built up with a one dimensional mechanical scan. The detector bandwidth is less than that in the first example by a factor equal to the number of detector elements used in a line. A third example uses a two-dimensional array of detectors, so that no mechanical scanning is necessary. In this case the bandwidth is narrowed again by a factor equal to the number of rows of elements used.

In the first example the element may basically be that described with reference to FIG. 1, i.e. incorporating substituted lead germanate as a pyroelectric detector. In the other two examples, a plurality of elements basically of the type described with reference to FIG. 1 may be used. In each case however each element or each of the elements will be followed conveniently by a single amplifier and processing circuit and an electroluminescent medium for converting the electrical signal generated by that element into an optical signal which can be displayed.

The pyroelectric effect has another application in a pyroelectric camera. A pyroelectric camera is similar to a conventional television camera but in which the photoconductive camera tube (vidicon) is replaced by a pyroelectric camera tube.

Figure 2:
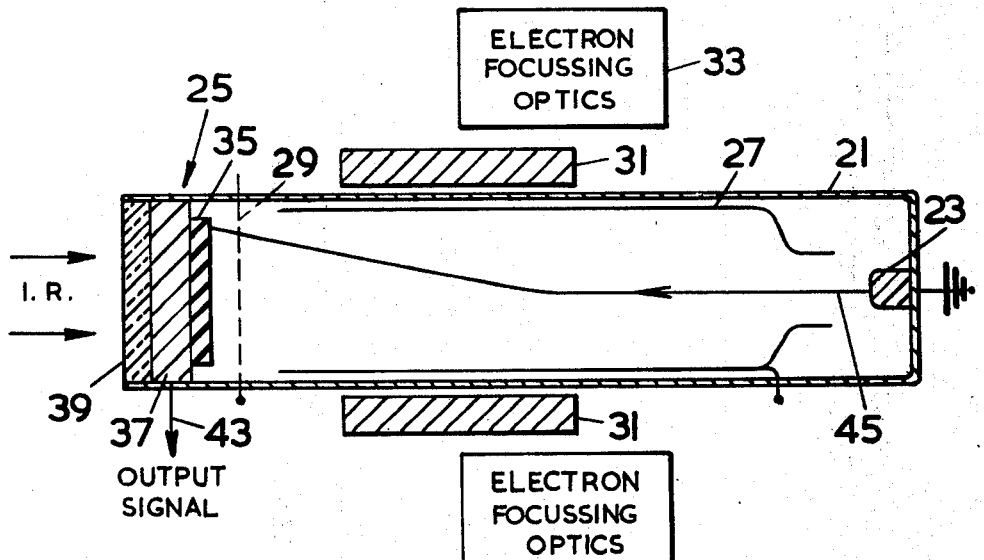
FIG. 2 is a schematic cross-sectional diagram of a pyroelectric camera embodying the present invention.

FIG. 2 is a schematic cross-sectional diagram of a pyroelectric camera tube system embodying the present invention. This system consists basically of a tube 21 which has been evacuated and then filled with an inert gas and, in the tube, a cathode 23, a target structure 25, a grid electrode 27 generally coaxial with the tube 21 and a mesh grid electrode 29 in front of the target structure 25. A deflection system 31 and a conventional electron focussing system 33 are provided on the outside of the tube 21. The target structure 25 consists of a slice 35 of either single crystal or ceramic substituted lead germanate typically 10 microns thick attached to an electrode 37 of conducting material such as nickel-chromium alloy (which is partly transmitting to infrared radiation) typically a few hundred Angstom units thick. The tube 21 is terminated by a faceplate 39 consisting of an infra-red transmitting material such as germanium.

The electrode 37 is attached to a lead 43 which is used to provide an output signal. The cathode 23 produces an electron beam 45 which is scanned across the surface of the slice 35. Infrared radiation IR, modulated by a chopper (not shown), is incident (from a given scene) via the faceplate 39 and the electrode 37 on the slice 35.

Wherever the slice 35 is irradiated an electric polarisation change occurs therein to an extent depending locally on the intensity of the infra-red radiation and a corresponding quantity of surface electric charge is formed. Supplementary charge is also formed by absorption of some of the radiation by the electrode 37 and subsequent thermal conduction to the slice 35.

The surface charge is quenched as the electron beam 45 is scanned across the surface of the layer 35. Charge then flows in the circuit comprising the layer 37 and the contacts 41 and 43 and may be detected as an electric current transient at the contact 43.

The grid electrodes 27 and 29 are provided to ionise the inert gas in the tube 21 and hence quench any excess negative charge left on the surface of slice 35 from the electron beam 45. These electrodes and the inert gas may be dispensed with if a positive voltage source (not shown) is connected to the slice 35 through a large impedance (not shown), in the manner described in U.S. Pat. No. 3,930,157, to provide quenching of the excess negative charge by positive charge leakage through the slice 35.

Figure 3:
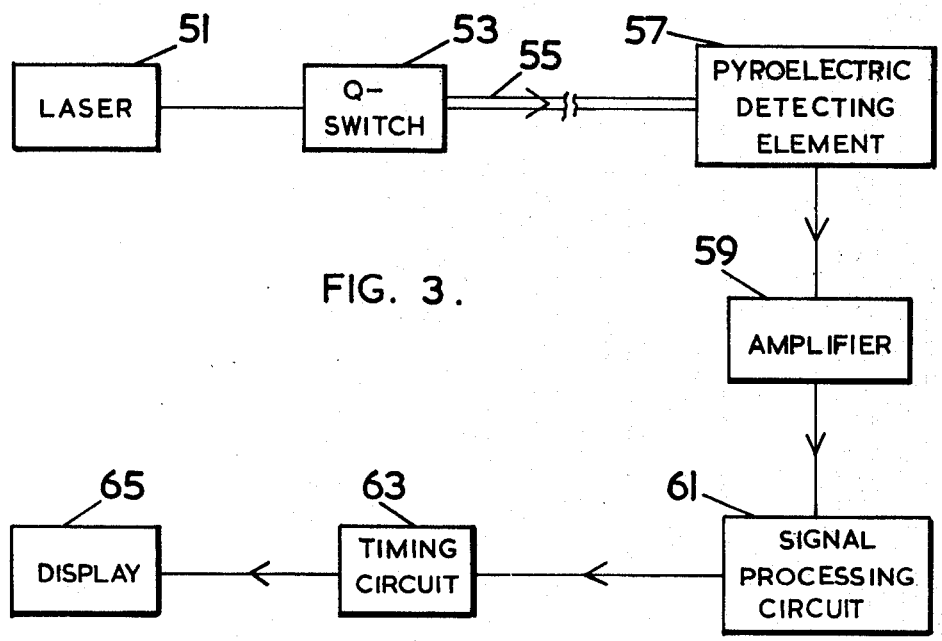
FIG. 3 and FIG. 4 are schematic block diagrams of alternative laser detection arrangements.

Another application of the pyroelectric effect is in the detection of laser radiation, particularly that from a carbon dioxide laser at 10.6 μm. FIG. 3 is a schematic block diagram of a detection system for a pulse laser beam. A laser 51 (such as a carbon dioxide laser) is Q-switched by means of a Q-switch 53. The output of the laser 51 consists of a beam 55 in the form of a series of pulses. The beam 55 is incident on a pyroelectric detecting element 57 similar to that described in FIG. 1, i.e. containing substituted lead germanate. The pyroelectric signal generated by the element 57 is amplified by means of an amplifier 59 similar to the amplifier 15 described with reference to FIG. 1. The signal is then extracted from noise in a conventional signal processing circuit 61, and the output of the circuit 61 is fed to a conventional timing circuit 63 which is used to measure the length (in time) of the laser pulses detected by the element 57. The output of the timing circuit 63 may be displayed on a cathode ray tube display 65 (on which the size of the detected pulse may be displayed).

The arrangement described with reference to FIG. 3 can provide a fairly fast and moderately sensitive means of measuring the pulse length of the laser beam 55. Alternatively, if a beam splitter (not shown) is located in the path of the beam 55, and the two resulting beams formed travel along different paths, the arrangement may be used to measure the difference in the time of travel along the two paths. The two beams may be detected both by the element 57 and the amplifier 59. Alternatively one beam may be detected by the element 57 and the amplifier 59 and the other may be detected by a separate (but similar) detector and the amplifier 59. In either case however the output of the timing circuit 63 is used to compare the time of detection of corresponding pulses from the two beams.

Figure 4:
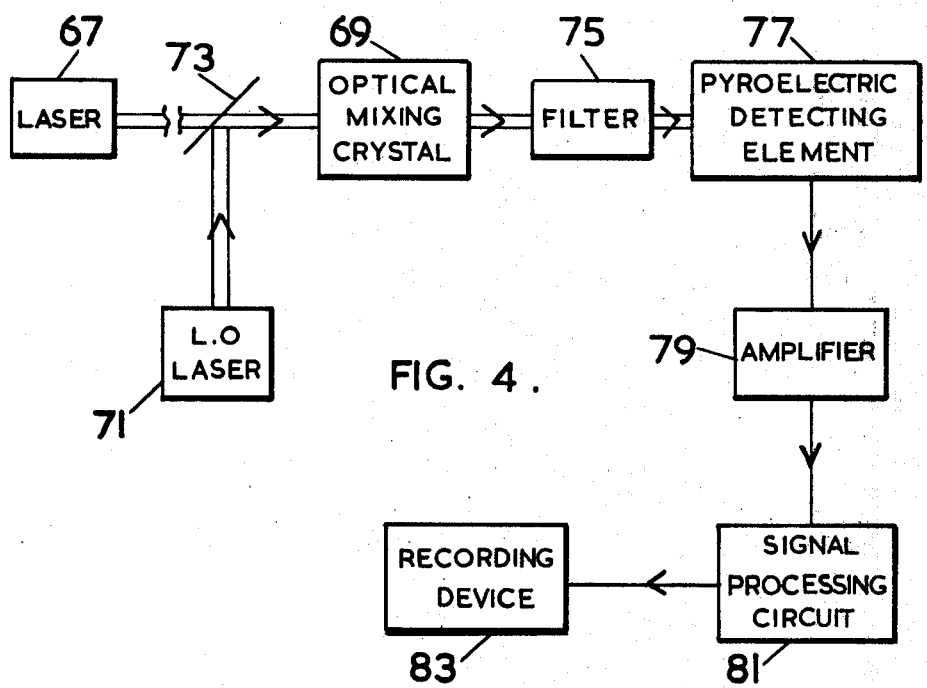

FIG. 4 is schematic block diagram of an alternative laser detection system embodying the invention in a superheterodyne detection arrangement. The radiation from a laser 67 is incident on an optical mixing crystal 69. The radiation from a local oscillator laser 71 is also arranged by means of a beam combiner 73 to be incident on the crystal 69. The radiation from both lasers is mixed at the crystal 69 and the optical difference frequency signal generated in the crystal 69 is selected by an optical filter 75 passing only frequencies in the range of the difference frequency. The optical output of the filter 75 is incident on a pyroelectric detector element 77 similar to that described with reference to FIG. 1, i.e. containing a slice of substituted lead germanate. The output of the element 77 is amplified by an amplifier 79 similar to the amplifier 15 described with reference to FIG. 1. The output of the amplifier 61 is processed by a conventional signal processing circuit 81 which is used to extract the amplified signal from noise, and the output of the circuit 81 is passed to a conventional recording device 83.

A signal having a frequency equal to the difference between the frequencies of the beams from the lasers 67, 71 is isolated by means of the crystal 69 and filter 75, detected by means of the element 77, the amplifier 79 and the circuit 81 and recorded at the recording means 83. The arrangement may be such that the laser 67 and the laser 71 are the same type of laser, but in which the laser 67 is frequency modulated so that the arrangement detects the modulation frequency.

We claim:

1. A pyroelectric material consisting of lead germanate doped with barium and having a compositional formula $Pb_{5-x}Ba_xGe_3O_{11}$, wherein $x$ is in the range $0 < x \leq 0.5$.

2. A material as claimed in claim 1 and wherein the material is single crystal material.

3. A material as claimed in claim 1 and wherein the material is polycrystalline ceramic material.

4. A material as claimed in claim 1 wherein $x$ in said compositional formula is between the inclusive limits 0.2 and 0.3.

5. A pyroelectric device including a piece of pyroelectric material and means for detecting pyroelectric charge developed on the piece when exposed to infrared radiation, wherein the improvement comprises using as said piece the pyroelectric material claimed in claim 1.

* * * * *